(12) United States Patent
Liu

(10) Patent No.: US 6,842,371 B2
(45) Date of Patent: Jan. 11, 2005

(54) PERMANENT MASTER BLOCK LOCK IN A MEMORY DEVICE

(75) Inventor: Mitch Liu, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 52 days.

(21) Appl. No.: 10/453,321

(22) Filed: Jun. 3, 2003

(65) Prior Publication Data

US 2004/0246781 A1 Dec. 9, 2004

(51) Int. Cl.[7] .............................................. G11C 16/22
(52) U.S. Cl. ............. 365/185.04; 365/195; 365/185.33; 711/163; 711/152
(58) Field of Search ....................... 365/185.04, 185.11, 365/185.33, 195, 230.06; 711/163, 164, 152

(56) References Cited

U.S. PATENT DOCUMENTS

| | | | |
|---|---|---|---|
| 5,592,641 A | 1/1997 | Fandrich | |
| 5,749,088 A | 5/1998 | Brown | |
| 5,845,332 A | 12/1998 | Inoue | |
| 5,930,826 A | 7/1999 | Lee | |
| 5,954,818 A | 9/1999 | Dalvi | |
| 6,026,016 A | 2/2000 | Gafken | |
| 6,031,757 A * | 2/2000 | Chuang et al. | 365/185.04 |
| 6,035,401 A | 3/2000 | Dalvi | |
| 6,073,243 A | 6/2000 | Dalvi | |
| 6,154,819 A | 11/2000 | Larsen | |
| 6,363,463 B1 | 3/2002 | Mattison | |
| 6,731,536 B1 * | 5/2004 | McClain et al. | 365/185.04 |
| 2001/0000816 A1 | 5/2001 | Baltar | |
| 2001/0014036 A1 | 8/2001 | Rapp | |

* cited by examiner

*Primary Examiner*—Michael S. Lebentritt
*Assistant Examiner*—J. H. Hur
(74) *Attorney, Agent, or Firm*—Leffert Jay & Polglaze, P.A.

(57) ABSTRACT

A master block lock control word is written to a mini array of non-volatile fuses. The control word is recalled and decoded. A successful recall of the control word generates an indication that the master block lock bit is permanently disabled from subsequent changes.

20 Claims, 4 Drawing Sheets

PERMANENT MASTER BLOCK LOCK IN A MEMORY DEVICE

TECHNICAL FIELD OF THE INVENTION

The present invention relates generally to memory devices and in particular the present invention relates to the locking of memory blocks in memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

Block lock bits have typically been used in flash memory devices to gate erase and program operations of the memory array. For example, if the lock bit for a particular memory block has been set, that block cannot be erased or programmed.

A master block lock bit can then be used to gate the block lock bit modifications. In other words, if the master block lock bit is set, a block lock bit that has been set to protect a block of memory cannot be reset by a memory device user. The master block lock bit protects portions of the memory from unauthorized access.

The master block lock bit may be reset by special test mode operations performed at the factory. This provides the factory with the capability of testing the operation of the block lock bits and the master block lock bit. The capability of resetting the master block lock bit is typically not made available to unauthorized users.

However, it may be possible for an unauthorized user to replicate the test mode instructions in order to be able to reset the master block lock bit and thus gain access to the block lock bits. This may be undesirable for a manufacturer that has used a flash memory device to store proprietary data that should not be changed.

For the reasons stated above, and for other reasons stated below which will become apparent to those skilled in the art upon reading and understanding the present specification, there is a need in the art for an improved locking scheme for permanently locking master block lock bits.

SUMMARY

The above-mentioned problems with permanently locking block lock bits and other problems are addressed by the present invention and will be understood by reading and studying the following specification.

The embodiments of the present invention encompass a memory device that has a mini array for storing a master block lock control word. A plurality of fuse latches are coupled to the mini array. The fuse latches latch the master block lock control word recalled from the mini array in response to a latch signal. A decoder circuit is coupled to the plurality of fuse latches. The decoder circuit generates an indication that the master block lock control word has been recalled from the plurality of fuse latches. This indication is then used to permanently lock the master block lock bit of the memory device.

Further embodiments of the invention include methods and apparatus of varying scope.

DETAILED DESCRIPTION

Figure 1:
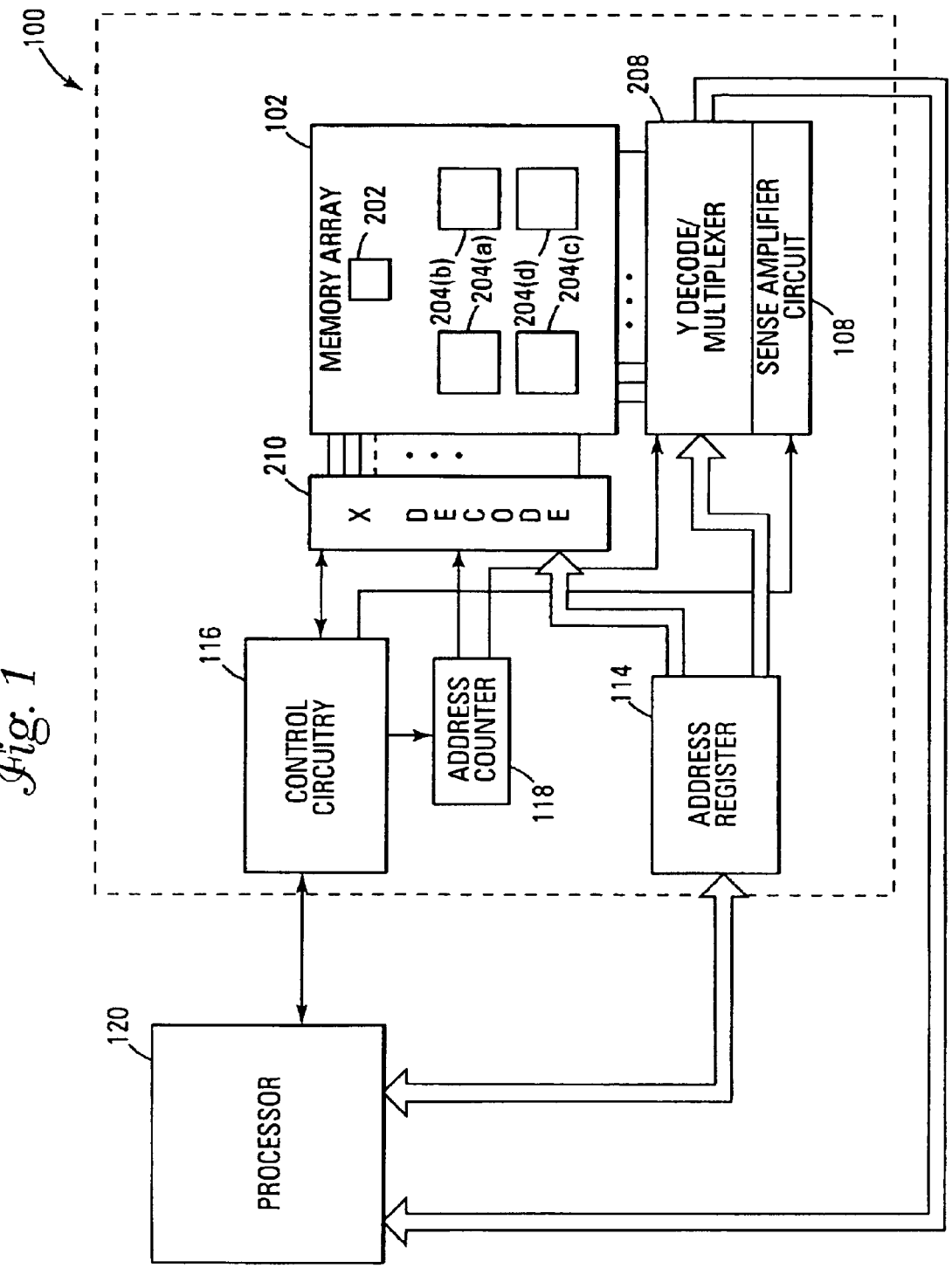
FIG. 1 shows a block diagram of one embodiment of a memory system of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified block diagram of an electronic system incorporating one embodiment of a flash memory 100 of the present invention having a fuse area. This area is also known as a mini-array.

As shown, the flash memory 100 has controller circuitry 116 to control memory operations to a memory array 102. These memory operations may include reading, programming, erasing, and executing the methods of the present invention. The controller circuitry 116 can also perform any tasks required by the embodiments of the present invention.

The flash memory is also shown having an address register 114, an address counter 118, an X decode circuit 210, a Y decode circuit/multiplexer circuit 208 and a sense amplifier circuit 108. The X decode circuit 210 decodes address requests to rows of memory cells in the memory array 102. Although not shown, the X decode circuit 210 may include a multiplexer circuit to combine two or more signals. The Y decode/multiplexer circuit 208 decodes and multiplexes address requests to columns of memory cells in the memory array 102. The sense amplifier circuit 108 reads addressed or accessed memory cells in the memory array 102.

The memory array 102 has four array blocks 204 (a–d) of memory cells that may be referred to as the primary array 204 (a–d). The memory array 102 is also shown as having a "mini array" 202. The mini array or fuse area is coupled to the memory array 102 so as to use the same peripheral circuitry as the array blocks 204 (ad). The mini array 202 can store set-up data, redundant row and column information, and other memory data. The uses of the mini array 102 are well known in the art.

Although, FIG. 1 is illustrated as having a primary array with four erasable array blocks 204 (a–c) of memory, it is understood in the art that the present invention is not limited to any certain quantity of erasable blocks. The present invention is also not limited to any memory block configuration.

An external processor 120 is coupled to the control circuitry 116 to provide external commands to the flash memory 100. The processor 120 is also coupled to the address register 114 to provide address requests. The processor 120 of the system of the present invention is any microprocessor, microcontroller, or other type of control circuitry.

The flash memory device illustrated in FIG. 1 has been simplified to facilitate a basic understanding of the features of the memory of the present invention. A more detailed understanding of internal circuitry and functions of flash memories are known to those skilled in the art.

Figure 2:
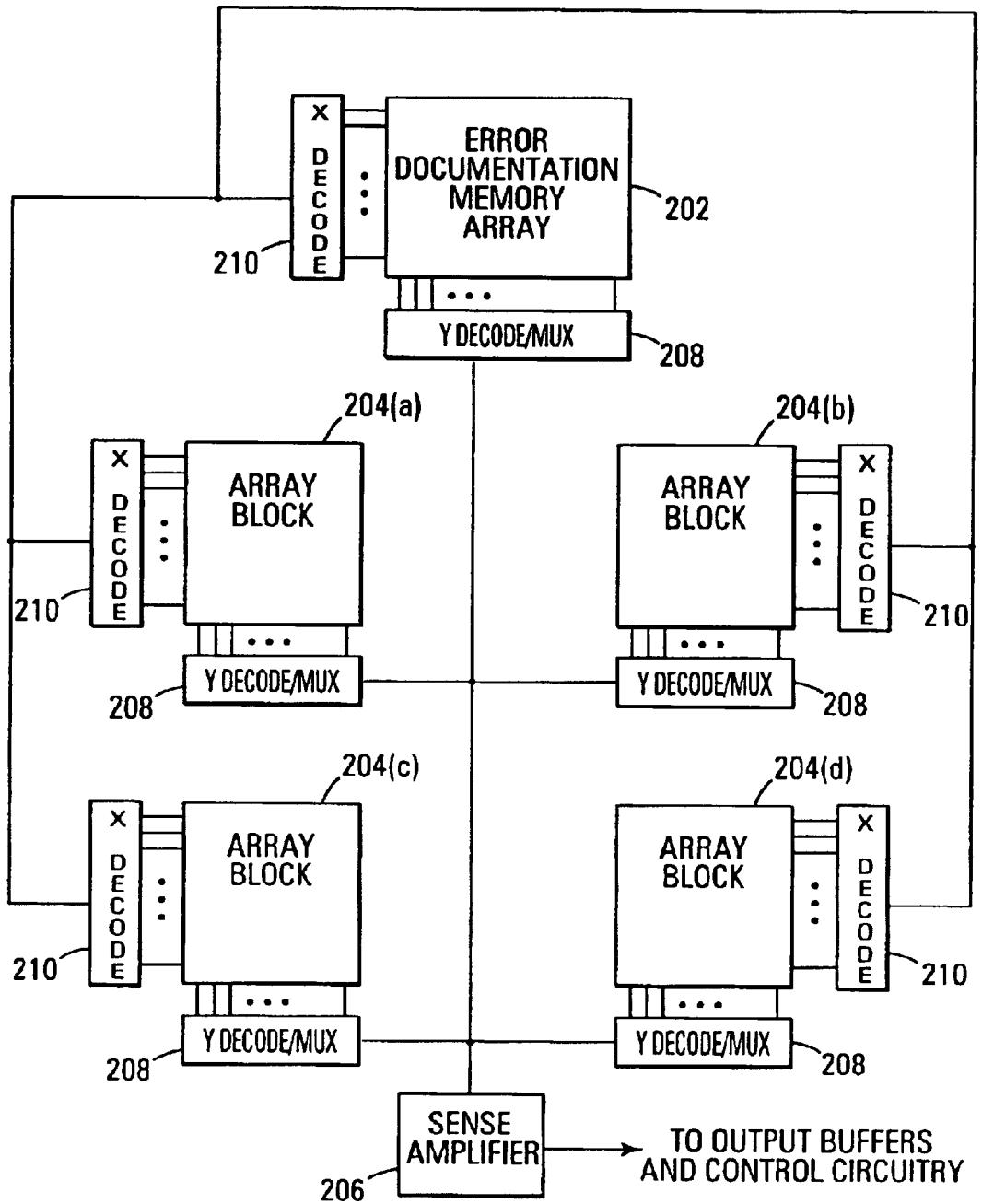
FIG. 2 shows a block diagram of one embodiment of the memory array incorporating the scratch control memory array of the present invention.

FIG. 2 illustrates a block diagram of one embodiment of the memory array 102 incorporating the mini array 202 and support circuitry 208 and 210 of the present invention. The array blocks 204 (a–d) are coupled to the X decode 210 and the Y decode/multiplexer 208. The mini array 202 is also coupled to the X decode 210 and the Y decode/multiplexer 208. This limits the amount of added elements needed to store and implement the operating parameters.

The sense amplifier 206 reads the state of the addressed cells in the array blocks 204 (a–d) as well as the memory cells of the mini array 202. As illustrated in FIG. 2, an output of sense amplifier 206 is selectively coupled to the output buffers of the memory device as is well know in the art. The output of the sense amplifier 206 is also coupled to the microsequencer or other control circuit so that the instructions stored in the error documentation memory array 202 can be accessed and executed.

An advantage of using a sense amplifier 206, as described, is that it creates a very reliable system. In addition, since the mini array 202 is coupled as a normal memory block, the memory is able to use an internal algorithm of the control circuitry 116 to verify if an operating parameter was successfully written to an associated local latch.

Figure 3:
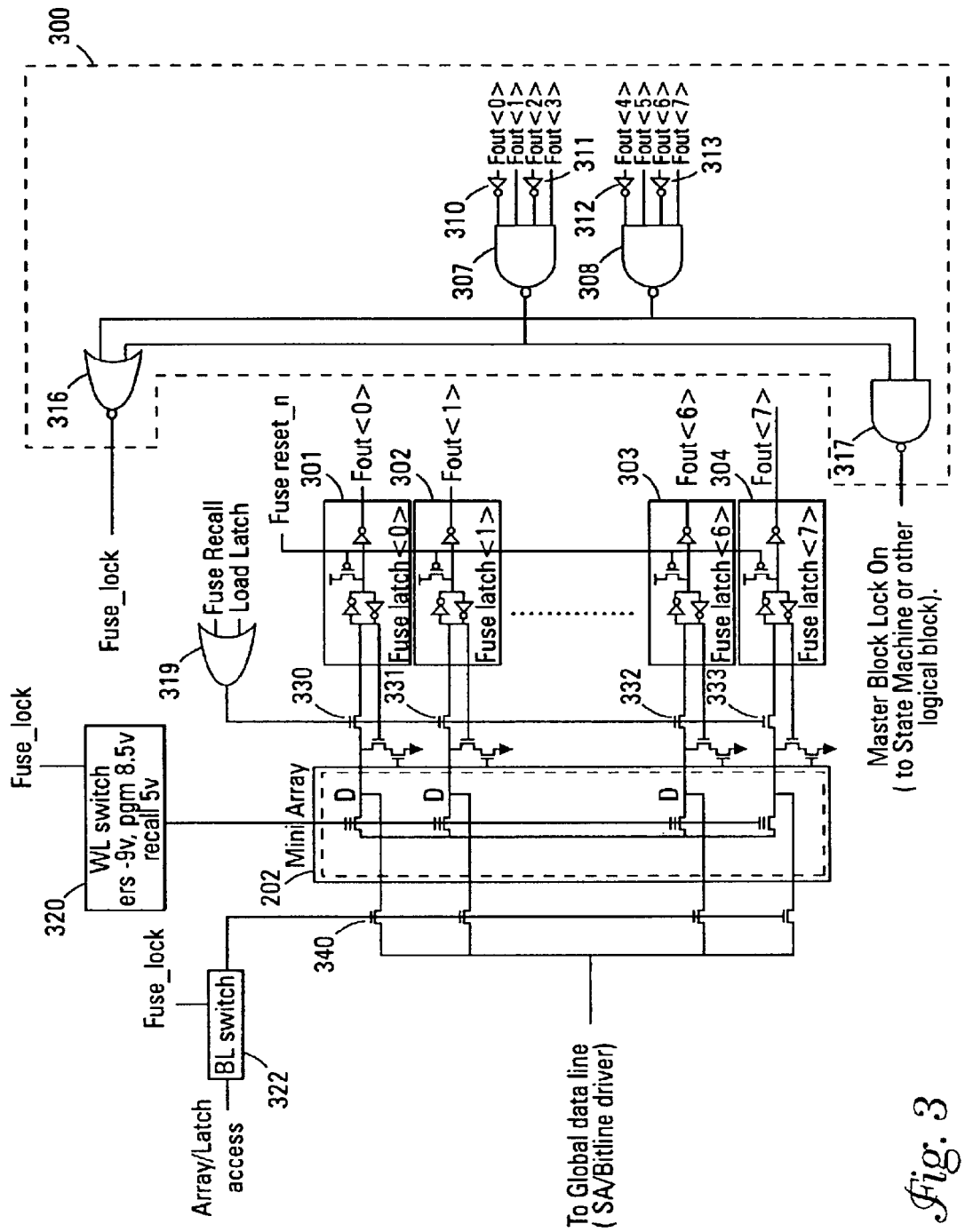
FIG. 3 shows a diagram of one embodiment of a permanent master block lock circuit of the present invention.

FIG. 3 illustrates a diagram of one embodiment of a permanent master block lock circuit of the present invention. The circuit uses a mini array 202, as described above, to store the master block lock control word of the present invention.

Operation of the mini array 202 is controlled by a bit line switch 322 (i.e., high voltage switch) and a word line switch 320. The bit line switch 322 is turned on by an array/latch access signal from a controller circuit, state machine, or other logic block. This signal indicates the controller circuit's desire to access the mini array 202 for a read operation. The bit line switch 322 turns on a column of transistors 340 that connect the fuses to a sense amplifier so that they can be read. The reading of the fuses with a sense amplifier is well known in the art and is not discussed further.

The word line switch 320 provides the proper voltage depending on the operation desired. In one embodiment, the word line switch 320 provides a −9V voltage to the mini array cells in order to erase the cells. An 8.5V voltage is applied to the cells by the word line switch when a program operation is desired. Similarly, a 5V voltage is provided when a recall (read) operation is performed. Alternate embodiments use other voltage levels for these operations.

The mini array 202 support circuits 320, 322, and 340 are shown for illustration purposes only. The operation of a mini array 202 is well known in the art and is not limited to any one support circuitry architecture.

The fuses of the mini array 202 are associated with a respective fuse latch circuit 301–304 in order to make the data stored in the fuse constantly available without the need for a typical flash memory read operation through the sense amplifiers. For purposes of clarity, only four of the latches 301–304 are illustrated. However, as is well known in the art, each fuse of the mini array 202 is associated with a latch circuit 301–304.

The Fuse Recall signal is generated by a $V_{CC}$ detector circuit (not shown). When the memory device is powered-up and $V_{CC}$ rises from 0V to a predetermined operational range (e.g., 2.6V–3.6V), a threshold is set prior to reaching this range. When the threshold is reached, the detector circuit generates a Fuse Reset_n signal to reset the latches. At this time, the detector circuit also generates the Fuse Recall pulse that recalls the mini array 202 data and stores it in the fuse latches 301–304. In one embodiment, the threshold is 2.0 V. Alternate embodiments use other thresholds.

The Load Latch signal, in one embodiment, is a test mode signal that is used during fabrication. The memory device vendor can load the fuse latches 301–304 directly without performing a normal load operation of programming/erasing the mini array and then loading the latches 301–304.

The Fuse Recall and Load Latch signals turn on the transistors 330–333 between the fuses and their respective fuse latch 301–304. While the transistor 330–333 is turned off, the fuse latch circuit 301–304 is isolated from its fuse.

After a recall operation, the fuse latch circuits 301–304 generate output signals Fout<0> through Fout<7>. This signal is then inverted 314. The Fout<0>–Fout<7> signals are the data that was stored in the mini array 202.

The Fout<0>–Fout<7> signals are input to a decoder logic circuit 300 that decodes the data stored in the latches. This circuit 300 is comprised of two NAND gates 307 and 308 and four inverters 310–313. In another embodiment, NOR and NAND logic gates 316 and 317 are also part of the decoder circuit.

If the data is the desired recalled control word, the output of the NAND gates 307 and 308 will each be a logic 0. Alternate embodiments use other logic architectures, depending on the control word to be decoded. For example, if the control word is 0x4BH, another logic circuit will be required to generate the logic 0 signals when this control word is recalled. The present invention is not limited to any one control word or any decoder logic architecture.

The outputs of the NAND gates 307 and 308 are input to a NOR gate 316 that outputs a logic 1 when both NAND outputs are a logic 0. This output is the Fuse_Lock signal that goes to the write line switch 320 and the bit line switch 322.

When the Fuse_Lock signal is asserted (i.e., recalled control word is true), the word line and bit line switches are disabled from any further write operations (e.g., erase, program). Also, the Load Latch signal is forced low so that a user cannot load new data into the latches, thus breaking the lock code.

Additionally, a NAND gate 317 outputs a Master Block Lock On signal to the memory device's controller circuit (e.g., state machine, control logic). The Master Block Lock On signal is a logic 1 when a recall operation has been performed and the recalled word has been decoded as the proper permanent Master Block lock control word.

In operation, a Master Block Lock control word is written to the mini array 202 to indicate that a permanent Master Block Lock operation is desired. In one embodiment, the control word is 0xAAH. Alternate embodiments use other control words.

The control word is latched into the fuse latches 301–304. A recall operation is then performed to read the data from the fuse latches 301–304. If the recall operation fetches the proper permanent Master Block Lock control word, the Fuse_Lock signal is asserted to a logic high. The Master Block Lock On signal also goes high to indicate to the memory device's controller circuit that the permanent Master Block Lock has been enabled. The controller circuit then prevents any further changes to the Master Block Lock bit.

Figure 4:
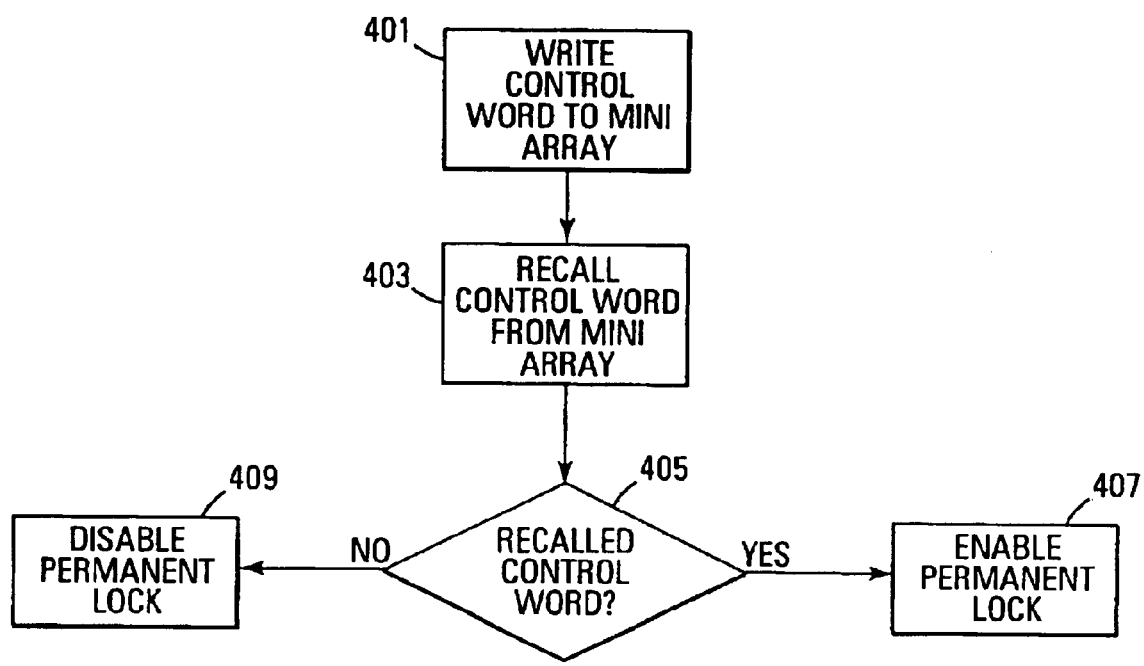
FIG. 4 shows flow chart of one embodiment of a permanent master block lock method of the present invention.

FIG. 4 illustrates a flow chart of one embodiment of a permanent master block lock method of the present invention. This embodiment writes a predetermined control word to the mini array 401. The control word is then recalled from the mini array 403.

If the recalled word is the permanent Master Block Lock control word 405, the permanent lock function of the present invention is enabled 407. If the recalled word is not the proper control word 405, the permanent lock function is either not enabled or disabled 409.

CONCLUSION

The embodiments of the present invention provide a permanent Master Block Lock function in a memory device, such as a flash memory. By writing a predetermined control word to the mini array and then performing a recall operation, the Master Block is permanently locked against further changes. This circuit is also fully testable.

The embodiments of the present invention are not limited to any one type of memory technology. For example, the permanent master block lock scheme in the mini array may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adapations of the invention will be apparent to those of ordinary skill in the art. Accordingly, this application is intended to cover any adaptations or variations of the invention. It is manifestly intended that this invention be limited only by the following claims and equivalenst thereof.

What is claimed is:

1. A memory device comprising:
   a mini array that stores a master block lock control word;
   a plurality of fuse latches, coupled to the mini array, for latching the master block lock control word from the mini array in response to a latch signal; and
   a decoder circuit, coupled to the plurality of fuse latches, for generating an indication that the master block lock control word has been recalled from the plurality of fuse latches.

2. The device of claim 1 wherein the decoder circuit comprises:
   a plurality of NAND logic gates having inputs coupled to outputs of the fuse latches; and
   a NOR logic gate coupled to outputs of the plurality of NAND logic gates, the NOR logic gate generating a logic one signal when the plurality of NAND logic gates generate logic zero outputs.

3. The device of claim 2 wherein the decoder circuit further comprises a NAND logic gate that generates a master block lock on indication signal to a controller circuit of the memory device when the master block lock control word has been recalled.

4. The device of claim 2 wherein the decoder circuit further comprises inverter logic gates coupled to predetermined outputs of the fuse latches in response to the master block lock control word.

5. The device of claim 1 wherein the mini array is comprised of a plurality of fuses for storing data.

6. The device of claim 5 wherein each fuse of the mini array is associated with a separate fuse latch.

7. The device of claim 1 wherein the indication enables the master block lock to be permanently enabled.

8. A flash memory device comprising:
   a mini array that stores a master block lock control word;
   a plurality of fuse latches, coupled to the mini array, for latching the master block lock control word from the mini array in response to a latch signal;
   a decoder circuit, coupled to the plurality of fuse latches, for generating an indication that the master block lock control word has been recalled from the plurality of fuse latches; and
   a controller circuit, coupled to the decoder circuit, for permanently locking the master block lock in response to the indication.

9. The device of claim 8 wherein the flash memory device is a NAND-type memory device.

10. The device of claim 8 wherein the flash memory device is a NOR-type memory device.

11. The device of claim 8 wherein the mini array is a non-volatile memory array.

12. The device of claim 8 wherein the controller circuit is a state machine.

13. A method for permanently locking a master block lock bit in a flash memory device, the method comprising:
   writing a master block lock control word to an array of non-volatile memory cells;
   recalling the master block lock control word from the array;
   determining if the master block lock control word has been recalled; and
   enabling a permanent lock of the master block lock bit if the master block lock control word has been recalled.

14. The method of claim 13 wherein enabling the permanent lock comprises a controller circuit reading a permanent lock indication signal and disabling any further attempts to change the master block lock bit.

15. The method of claim 13 wherein the mini array is a non-volatile memory array.

16. The method of claim 13 and further including disabling word line and bit line switches if the master block lock word has been recalled.

17. A method for permanently locking a master block lock bit in a flash memory device having a controller circuit, the method comprising:
   writing a master block lock control word to a mini array;
   recalling the master block lock control word from the mini array;
   disabling word line and bit line switches if the master block lock control word has been recalled; and
   indicating successful recall of the master block lock bit to the controller circuit if the master block lock control word has been recalled.

18. The method of claim 17 wherein the controller circuit disables subsequent attempts at modifying the master block lock bit upon indication of the successful recall of the master block lock control word.

19. A flash memory device comprising:

means for writing a master block lock control word to a non-volatile memory array;

a word line switch coupled to the non-volatile memory array;

a bit line switch coupled to the non-volatile memory array;

means for controlling operation of the flash memory device;

means for recalling the master block lock control word from the array;

means for disabling the word line and the bit line switches if the master block lock control word has been recalled; and means for indicating, to the means for controlling, disablement of subsequent changes to a master block lock bit if the master block lock control word has been recalled.

20. An electronic system comprising:

a processor that generates control signals for the system; and a flash memory device, coupled to the processor, for storing data, the flash memory device comprising:

a non-volatile memory array;

a mini array that stores a master block lock control word;

a plurality of fuse latches, coupled to the mini array, for latching the master block lock control word from the mini array in response to a latch signal; and a decoder circuit, coupled to the plurality of fuse latches, for generating an indication that the master block lock control word has been recalled from the plurality of fuse latches.

* * * * *